US012635337B2

(12) United States Patent
Kim

(10) Patent No.: US 12,635,337 B2
(45) Date of Patent: May 19, 2026

(54) PIXEL CIRCUIT INCLUDING TRANSISTOR INCLUDING TERMINAL INCLUDING POLYCRYSTALLINE SILICON DOPED WITH IMPURITY AND DISPLAY DEVICE INCLUDING THE PIXEL CIRCUIT

(71) Applicant: Samsung Display Co., Ltd., Yongin-si (KR)

(72) Inventor: Keunwoo Kim, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 434 days.

(21) Appl. No.: 18/104,556

(22) Filed: Feb. 1, 2023

(65) Prior Publication Data

US 2023/0422554 A1     Dec. 28, 2023

(30) Foreign Application Priority Data

Jun. 24, 2022     (KR) ........................ 10-2022-0077430

(51) Int. Cl.
*H01L 29/08*     (2006.01)
*H10K 59/121*     (2023.01)

(52) U.S. Cl.
CPC ..... *H10K 59/1213* (2023.02); *H10K 59/1216* (2023.02)

(58) Field of Classification Search
CPC ........................ H10K 59/1213; H10K 59/1216
USPC ........................................................ 257/40
See application file for complete search history.

(56) References Cited

U.S. PATENT DOCUMENTS

| | | | |
|---|---|---|---|
| 10,482,817 B2 | 11/2019 | Kim et al. | |
| 2002/0021293 A1 | 2/2002 | Tam | |
| 2006/0187153 A1 | 8/2006 | Nathan et al. | |
| 2010/0164847 A1 | 7/2010 | Lee et al. | |
| 2010/0330718 A1 | 12/2010 | Lee et al. | |
| 2019/0180688 A1* | 6/2019 | Yang | G09G 3/3258 |
| 2021/0193036 A1 | 6/2021 | Huang et al. | |
| 2022/0109042 A1* | 4/2022 | Kim | H10K 59/131 |

FOREIGN PATENT DOCUMENTS

| | | | | |
|---|---|---|---|---|
| CN | 108154846 A | | 6/2018 | |
| CN | 109920805 A | * | 6/2019 | ........ H10D 86/0221 |
| JP | 2005340772 A | * | 12/2005 | ............ H10D 1/692 |
| KR | 20020032571 A | | 5/2002 | |
| KR | 20070102577 A | | 10/2007 | |

(Continued)

OTHER PUBLICATIONS

Office Action dated Apr. 8, 2026 for Korean Patent Application No. 10-2022-0077430, 22 pages.

*Primary Examiner* — Phuc T Dang
(74) *Attorney, Agent, or Firm* — CANTOR COLBURN LLP

(57) ABSTRACT

A pixel circuit includes a first transistor a first gate terminal electrically connected to a gate node, a first terminal including polycrystalline silicon doped with a first impurity and electrically connected to a first voltage and a second terminal including polycrystalline silicon doped with the first impurity, and a second transistor a second gate terminal electrically connected to a first gate signal, a third terminal including polycrystalline silicon doped with a second impurity and electrically connected to the gate node and a fourth terminal including polycrystalline silicon doped with the second impurity.

10 Claims, 12 Drawing Sheets

(56)　　　　　References Cited

FOREIGN PATENT DOCUMENTS

| KR | 20100077649 | A | 7/2010 |
|----|-------------|---|--------|
| KR | 20110001054 | A | 1/2011 |
| KR | 1020180064619 | A | 6/2018 |
| KR | 1020200047898 | A | 5/2020 |
| KR | 1020210049220 | A | 5/2021 |
| KR | 20210112428 | A | 9/2021 |

* cited by examiner

FIG. 4

PIXEL CIRCUIT INCLUDING TRANSISTOR INCLUDING TERMINAL INCLUDING POLYCRYSTALLINE SILICON DOPED WITH IMPURITY AND DISPLAY DEVICE INCLUDING THE PIXEL CIRCUIT

This application claims priority to Korean Patent Application No. 10-2022-0077430, filed on Jun. 24, 2022, and all the benefits accruing therefrom under 35 U.S.C. § 119, the content of which in its entirety is herein incorporated by reference.

BACKGROUND

1. Field

Embodiments of the invention relate to pixel circuit and display device including the pixel circuit.

2. Description of the Related Art

A display device includes pixels that emit light. The pixels are electrically connected to the pixel circuit and emit light in response to a driving current generated by the pixel circuit. The pixel circuit receives a gate signal, a data voltage, a driving voltage, and the like to generate the driving current. The pixel circuit includes at least one transistor and at least one capacitor.

SUMMARY

Embodiments provide a pixel circuit.

Embodiments provide a display device including the pixel circuit.

A pixel circuit in an embodiment includes a first transistor including a first gate terminal electrically connected to a gate node, a first terminal including polycrystalline silicon doped with a first impurity and electrically connected to a first voltage and a second terminal including polycrystalline silicon doped with the first impurity, a second transistor including a second gate terminal electrically connected to a first gate signal, a third terminal including polycrystalline silicon doped with a second impurity different from the first impurity and electrically connected to the gate node and a fourth terminal including polycrystalline silicon doped with the second impurity, a light-emitting diode including an anode terminal electrically connected to the second terminal and a cathode terminal electrically connected to a second voltage.

In an embodiment, the first impurity may include a P-type impurity, and the second impurity may include an N-type impurity.

In an embodiment, the first transistor may be a p-channel metal-oxide-semiconductor ("PMOS") transistor, and the second transistor may be an n-channel metal-oxide-semiconductor ("NMOS") transistor.

In an embodiment, the anode terminal may be further electrically connected to the fourth terminal.

In an embodiment, the pixel circuit may further include a storage capacitor including a first capacitor terminal electrically connected to the gate node and a second capacitor terminal electrically connected to an initialization voltage.

In an embodiment, the pixel circuit may further include a program capacitor including a third capacitor terminal electrically connected to a data voltage and a fourth capacitor terminal electrically connected to the anode terminal.

In an embodiment, the pixel circuit may further include a third transistor including a third gate terminal electrically connected to a second gate signal, a fifth terminal including polycrystalline silicon doped with the second impurity and electrically connected to the gate node and a sixth terminal including polycrystalline silicon doped with the second impurity.

In an embodiment, the pixel circuit may further include a third transistor including a third gate terminal electrically connected to a second gate signal, a fifth terminal including polycrystalline silicon doped with the first impurity and electrically connected to the gate node and a sixth terminal including polycrystalline silicon doped with the first impurity.

A pixel circuit in another embodiment includes a first transistor including a first gate terminal electrically connected to a gate node, a first terminal including polycrystalline silicon doped with a first impurity and electrically connected to a first voltage and a second terminal including polycrystalline silicon doped with the first impurity, a second transistor including a second gate terminal electrically connected to a first gate signal, a third terminal including polycrystalline silicon doped with the first impurity and electrically connected to the gate node and a fourth terminal including polycrystalline silicon doped with the first impurity, a third transistor including a third gate terminal electrically connected to a second gate signal, a fifth terminal including polycrystalline silicon doped with the second impurity different from the first impurity and electrically connected to the gate node and a sixth terminal including polycrystalline silicon doped with the second impurity and a light-emitting diode including an anode terminal electrically connected to the second terminal and a cathode terminal electrically connected to a second voltage.

In an embodiment, the first impurity may include a P-type impurity, and the second impurity includes an N-type impurity.

In an embodiment, the first transistor may be a PMOS transistor, and the second transistor may be an NMOS transistor.

A display device in an embodiment may include a substrate, a first active pattern disposed on the substrate and including polycrystalline silicon doped with a first impurity, a first gate electrode disposed on the first active pattern, a second active pattern disposed on the first gate electrode and including polycrystalline silicon doped with a second impurity different from the first impurity and a second gate electrode disposed on the second active pattern.

In an embodiment, the first impurity may include a P-type impurity, and the second impurity includes an N-type impurity.

In an embodiment, the P-type impurity may include boron (B) ions, and the N-type impurity may include phosphorus (P) ions.

In an embodiment, the first impurity may be doped into a first doped area of the first active pattern and a second doped area of the first active pattern, and the second impurity may be doped into a third doped area of the second active pattern and a fourth doped area of the second active pattern.

In an embodiment, the display device may include an anode electrode, the first doped area may be provided with a first voltage, the second doped area may be electrically connected to the fourth doped area and the anode electrode, and the third doped area may be electrically connected to the first gate electrode.

In an embodiment, the display device may further include a third active pattern disposed in a same layer as the second active pattern and including polycrystalline silicon doped with the second impurity and a third gate electrode disposed on the third active pattern.

In an embodiment, the first impurity may be doped into a first doped area of the first active pattern and a second doped area of the first active pattern, and the second impurity may be doped into a third doped area of the second active pattern, a fourth doped area of the second active pattern, a fifth doped area of the third active pattern, and a sixth doped area of the third active pattern.

In an embodiment, the first doped area may be provided with a first voltage, and the second doped area may be electrically connected to the fourth doped area and the sixth doped area, and the third doped area may be electrically connected to the first gate electrode Therefore, the pixel circuit in embodiments may include a first transistor and a second transistor. The first transistor may include polycrystalline silicon doped with a first impurity (e.g., boron (B) ions). Accordingly, the first transistor may be a PMOS transistor. The second transistor may include polycrystalline silicon doped with a second impurity (e.g., phosphorus (P) ions). Accordingly, the second transistor may be an NMOS transistor.

In order to implement the first transistor and the second transistor as different types of transistors, the display device including the pixel circuit may include a first active pattern and a second active pattern. The first active pattern may include polycrystalline silicon doped with the first impurity. The second active pattern may be disposed on the first active pattern and include polycrystalline silicon doped with the second impurity. As the second active pattern is disposed on the first active pattern, an area of the pixel circuit may be reduced and the resolution of the display device may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

FIG. 4 is a timing diagram illustrating the display device of FIG. 2.

DETAILED DESCRIPTION

Figure 1:
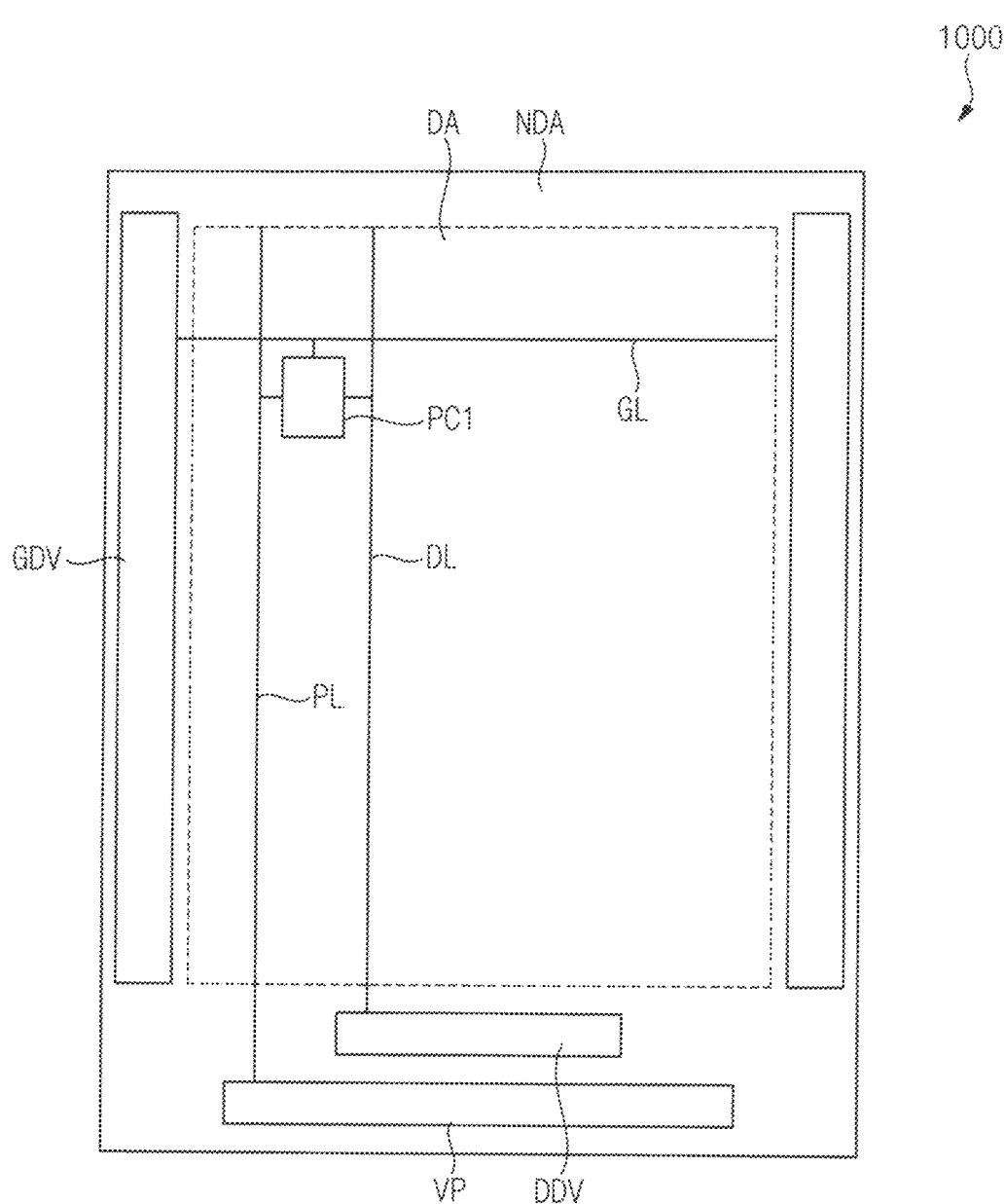
FIG. 1 is a plan view illustrating an embodiment of a display device according to the invention.

Embodiments of the disclosure now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 2:
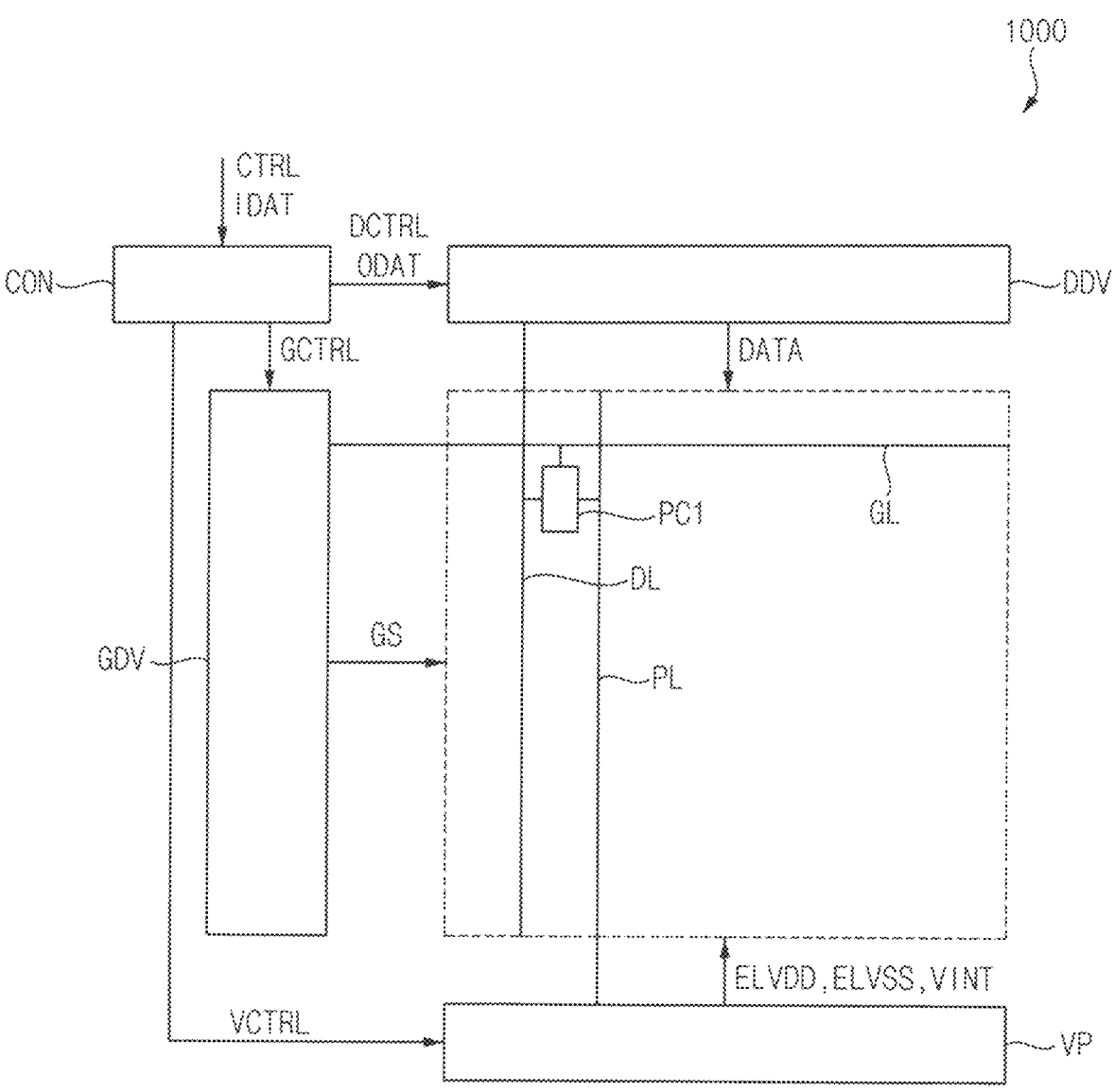
FIG. 2 is a block diagram illustrating the display device of FIG. 1
Figure 3:
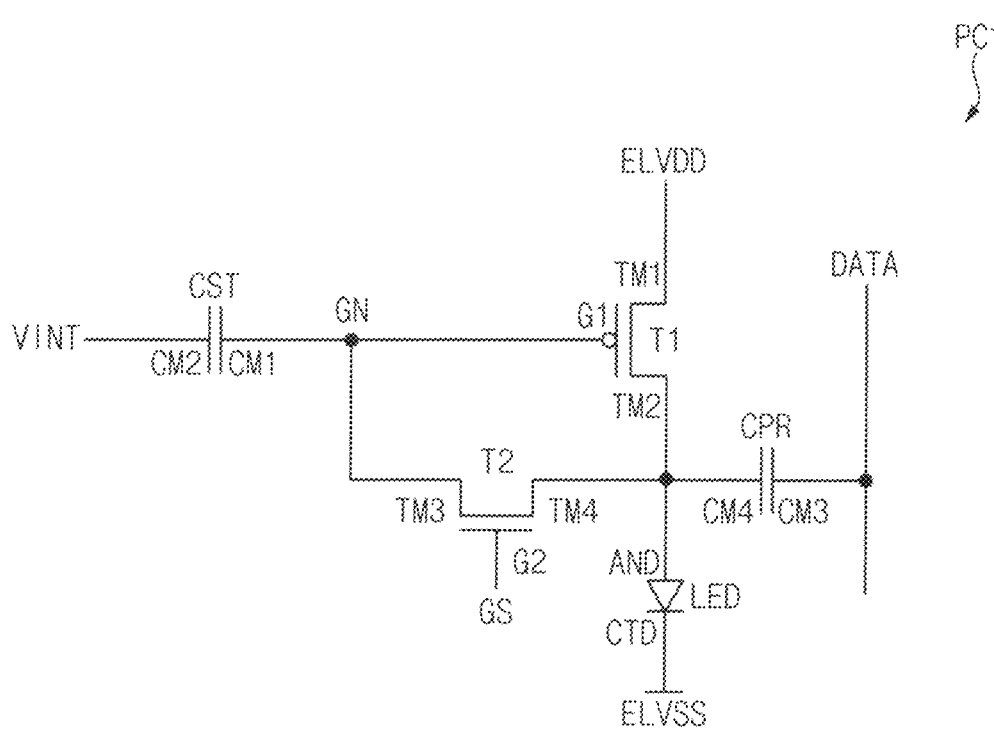
FIG. 3 is a circuit diagram illustrating a pixel circuit included in the display device of FIG. 2.
Figure 4:
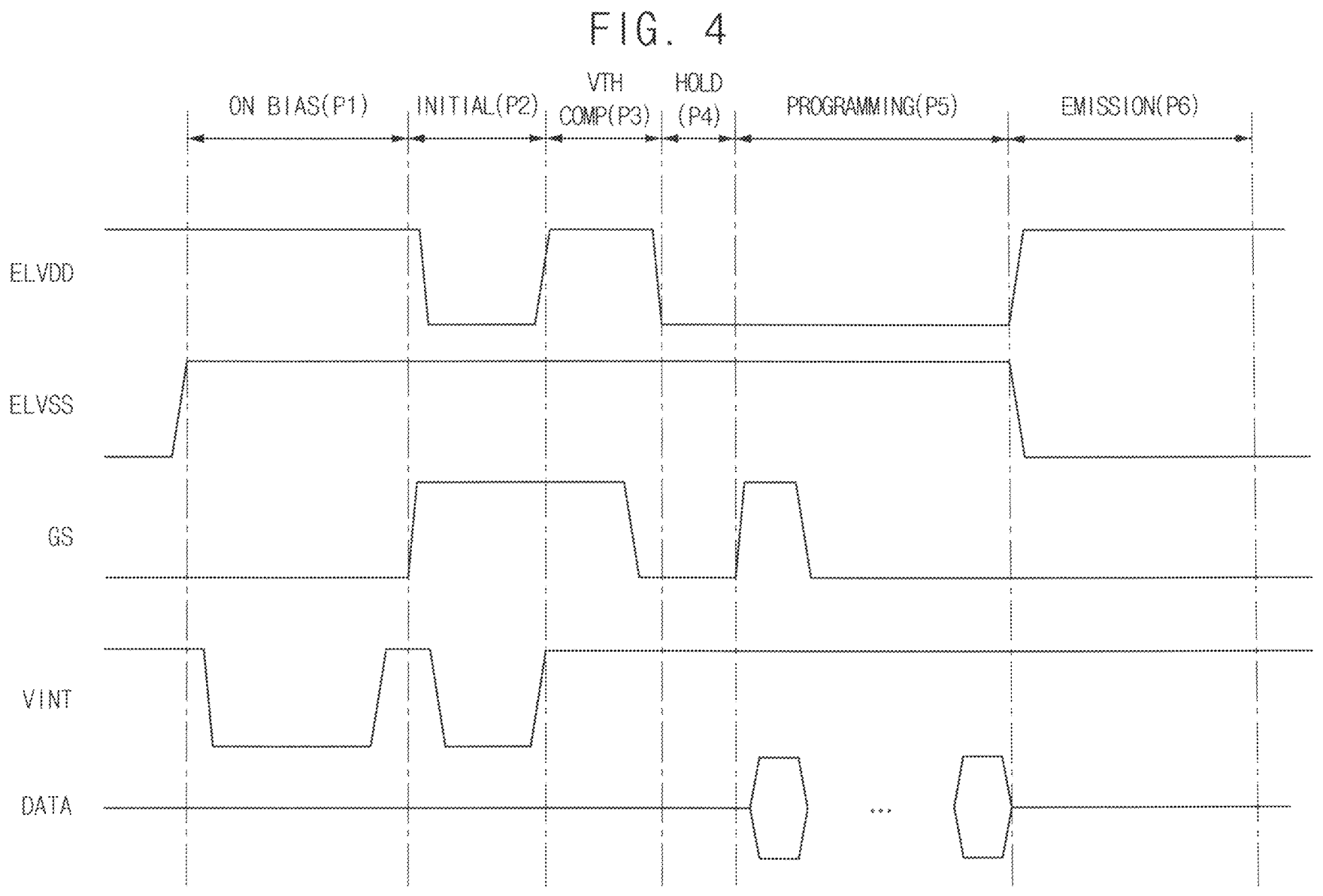

FIG. 1 is a plan view illustrating an embodiment of a display device according to the invention, FIG. 2 is a block diagram illustrating the display device of FIG. 1, and FIG. 3 is a circuit diagram illustrating a pixel circuit included in the display device of FIG. 2, and FIG. 4 is a timing diagram illustrating the display device of FIG. 2.

Referring to FIG. 1, an embodiment of the display device 1000 may be divided into a display area DA and a non-display area NDA. The display area DA may display an image. The non-display area NDA may surround at least a portion of the display area DA, and a gate driver GDV, a data driver DDV, and a voltage driver VP may be placed at the non-display area NDA.

The pixel circuit PC1 may be connected to the gate driver GDV through a gate line GL, may be connected to the data driver DDV through a data line DL, and may be connected to the voltage driver VP through a voltage line PL.

Referring to FIG. 2, the display device 1000 may further include a controller CON. The controller CON may control the gate driver GDV, the data driver DDV, and the voltage driver VP.

The pixel circuit PC1 may be electrically connected to the gate driver GDV, the data driver DDV, and the voltage driver VP. Accordingly, the pixel circuit PC1 may receive a gate signal GS, a data voltage DATA, a first voltage ELVDD, a second voltage ELVSS, and an initialization voltage VINT.

The gate driver GDV may receive a gate control signal GCTRL from the controller CON. The gate driver GDV may generate the gate signal GS based on the gate control signal GCTRL. The gate signal GS may be provided to the pixel circuit PC1 through the gate line GL.

The data driver DDV may receive a data control signal DCTRL and an output image data ODAT from the controller CON. The data driver DDV may generate the data voltage DATA based on the data control signal DCTRL and the output image data ODAT. The data voltage DATA may be provided to the pixel circuit PC1 through the data line DL.

The voltage driver VP may receive a voltage control signal VCTRL from the controller CON. The voltage driver VP may generate the first voltage ELVDD, the second voltage ELVSS, and the initialization voltage VINT based on the voltage control signal VCTRL. The first voltage ELVDD, the second voltage ELVSS, and the initialization voltage VINT may be provided to the pixel circuit PC1.

The controller CON may receive a control signal CTRL and an input image data IDAT from an external device (e.g., GPU). The controller CON may generate the gate control signal GCTRL, the data control signal DCTRL, the output image data ODAT, and the voltage control signal VCTRL based on the control signal CTRL and the input image data IDAT.

Referring to FIG. 3, the pixel circuit PC1 may include a first transistor T1, a second transistor T2, a storage capacitor CST, a program capacitor CPR, and a light-emitting diode LED.

The first transistor T1 may include a first gate terminal G1 electrically connected to a gate node GN, a first terminal TM1 electrically connected to the first voltage ELVDD and a second terminal TM2 electrically connected to and the light-emitting diode LED.

In an embodiment, the first terminal TM1 and the second terminal TM2 may include or consist of polycrystalline silicon doped with a first impurity. In an embodiment, the first impurity may include a P-type impurity (e.g., boron (B) ions), for example.

The second transistor T2 may include a second gate terminal G2 electrically connected to the gate signal GS, a third terminal TM3 electrically connected to the gate node GN, and a fourth terminal TM4 electrically connected to the light-emitting diode LED.

In an embodiment, the third terminal TM3 and the fourth terminal TM4 may include or consist of polycrystalline silicon doped with a second impurity. In an embodiment, the second impurity may be different from the first impurity, and may include an N-type impurity (e.g., phosphorus (P) ions), for example.

In an embodiment, the first transistor T1 may be a p-channel metal-oxide-semiconductor ("PMOS") transistor, and the second transistor T2 may be an n-channel metal-oxide-semiconductor ("NMOS") transistor.

The storage capacitor CST may include a first capacitor terminal CM1 electrically connected to the gate node GN and a second capacitor terminal CM2 electrically connected to the initialization voltage VINT.

The program capacitor CPR may include a third capacitor terminal CM3 electrically connected to the data voltage DATA and a fourth capacitor terminal CM4 electrically connected to the light-emitting diode LED.

The light-emitting diode LED may include an anode terminal AND electrically connected to the second terminal TM2 and the fourth terminal TM4 and a cathode terminal CTD electrically connected to the second voltage ELVSS.

Referring to FIGS. 3 and 4, in an on-bias period P1, the first voltage ELVDD may have a high level, the second voltage ELVSS may have a high level, and the gate signal GS may have a low level, and the initialization voltage VINT may have a low level.

In the on-bias period P1, the first transistor T1 may be turned on and the second transistor T2 may be turned off. In order to improve hysteresis, an on bias may be provided to the first transistor T1. Also, in order to prevent the light-emitting diode LED from emitting light, the second voltage ELVSS may have a high level.

In an initialization period P2 following the on-bias period P1, the first voltage ELVDD may have a low level, the second voltage ELVSS may have a high level, and the gate signal GS may have a high level, and the initialization voltage VINT may have a low level.

In the initialization period P2, the first transistor T1 and the second transistor T2 may be turned on. During the initialization period P2, the gate node GN which is the gate terminal of the first transistor T1 may be initialized.

In a threshold compensation period P3 following the initialization period P2, the first voltage ELVDD may have a high level, and the second voltage ELVSS may have a high level, and the gate signal GS may have a low level, and the initialization voltage VINT may have a high level.

In the threshold compensation period P3, the first transistor T1 and the second transistor T2 may be turned on. During the threshold compensation period P3, as the first voltage ELVDD has a high level, the threshold voltage of the first transistor T1 may be compensated.

In a hold period P4 following the threshold compensation period P3, the first voltage ELVDD may have a low level, and the second voltage ELVSS may have a high level, and the gate signal GS may have a low level, and the initialization voltage VINT may have a high level.

In a programming period P5 following the hold period P4, the first voltage ELVDD may have a low level, the second voltage ELVSS may have a high level, and the gate signal GS may sequentially have a high level, and the initialization voltage VINT may have a high level.

During the programming period P5, the first transistor T1 and the second transistor T2 may be turned on. While the gate signal GS has a high level, the data voltage DATA may be entered into the pixel circuit PC1.

In a light emission period P6 following the programming period P5, the first voltage ELVDD may have a high level, the second voltage ELVSS may have a low level, and the gate signal GS may have a low level, and the initialization voltage VINT may have a high level.

In the emission period P6, the first transistor T1 may be turned on and the second transistor T2 may be turned off. When the first transistor T1 is turned on, the first voltage ELVDD has a high level, and the second voltage ELVSS has a low level, a driving current generated in the first transistor T1 may be provided to the light-emitting diode LED.

Figure 5:
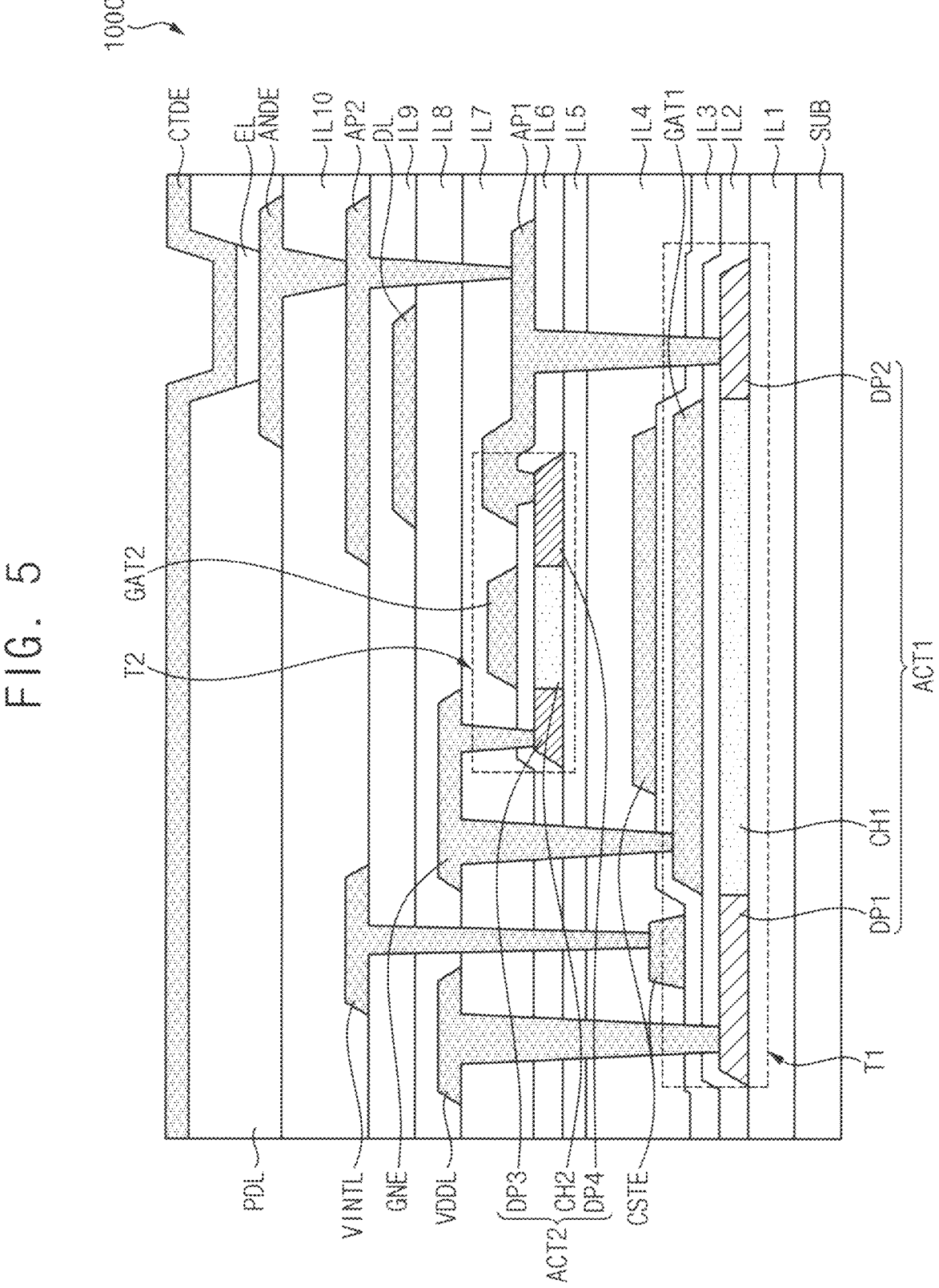
FIG. 5 is a cross-sectional view illustrating the display device of FIG. 1.

FIG. 5 is a cross-sectional view illustrating the display device of FIG. 1.

Referring to FIG. 5, the display device 1000 may include a substrate SUB, a first insulating layer IL1, a first active pattern ACT1, a second insulating layer IL2, a first gate electrode GAT1, a third insulating layer IL3, a capacitor electrode CSTE, a fourth insulating layer IL4, a fifth insulating layer IL5, a second active pattern ACT2, a sixth insulating layer IL6, a second gate electrode GAT2, a first anode pad AP1, a seventh insulating layer IL7, a high voltage line VDDL, a gate node electrode GNE, an eighth insulating layer IL8, a data line DL, a ninth insulating layer IL9, an initialization voltage line VINTL, a second anode pad AP2, a tenth insulating layer IL10, an anode electrode ANDE, a pixel defining layer PDL, a light-emitting layer EL, and a cathode electrode CTDE.

The substrate SUB may include a transparent or opaque material. In an embodiment, the material that may be used as the substrate SUB may include glass, quartz, plastic, or the like. These may be used alone or in combination with each other.

The first insulating layer IL1 may be disposed on the substrate SUB. The first insulating layer IL1 may uniformly provide heat to the first active pattern ACT1 during the crystallization process of the first active pattern ACT1. In an embodiment, the first insulating layer IL1 may include an insulating material. In embodiments, the insulating material that may be used as the first insulating layer IL1 may include silicon oxide, silicon nitride, silicon oxynitride, or the like. These may be used alone or in combination with each other. Also, the first insulating layer IL1 may include or consist of a single layer or a multilayer.

The first active pattern ACT1 may be disposed on the first insulating layer IL1. The first active pattern ACT1 may include a first channel area CH1, a first doped area DP1, and a second doped area DP2. The first channel area CH1 may overlap the first gate electrode GAT1. Each of the first doped area DP1 and the second doped area DP2 may be adjacent to the first channel area CH1.

In an embodiment, the first active pattern ACT1 may include or consist of a silicon semiconductor material or an oxide semiconductor material. In embodiments, the silicon semiconductor material that may be used as the first active pattern ACT1 may include amorphous silicon, polycrystalline silicon, or the like. In embodiments, the oxide semiconductor material that may be used as the first active pattern ACT1 may include indium-gallium-zinc-oxide ("IGZO") (InGaZnO), indium-tin-zinc-oxide ("ITZO") (InSnZnO), or the like. In addition, the oxide semiconductor material may further include indium (In), gallium (Ga), tin (Sn), zirconium (Zr), vanadium (V), hafnium (Hf), cadmium (Cd), germanium (Ge), chromium (Cr), titanium (Ti), or zinc (Zn). These may be used alone or in combination with each other.

In an embodiment, the first active pattern ACT1 may include polycrystalline silicon doped with the first impurity. In an embodiment, polycrystalline silicon may be formed by performing the crystallization process on amorphous silicon, and the first doped area DP1 and the second doped area DP2 may be doped with the first impurity, for example. In an embodiment, the crystallization process may be performed at about 450 degrees Celsius (° C.) for about 60 minutes, for example.

In an embodiment, the first impurity may include a P-type impurity. Accordingly, the first transistor T1 may be implemented as the PMOS transistor. In an embodiment, the P-type impurity may include boron (B) ions. A first dose amount in which the boron (B) ions are doped into the first active pattern ACT1 may be approximately 1e15 atoms/cm2, for example.

The second insulating layer IL2 may be disposed on the first active pattern ACT1. In an embodiment, the second insulating layer IL2 may include or consist of an insulating material. In embodiments, the insulating material that may be used as the second insulating layer IL2 may include silicon oxide, silicon nitride, silicon oxynitride, or the like.

The first gate electrode GAT1 may be disposed on the second insulating layer IL2. The first active pattern ACT1 and the first gate electrode GAT1 may constitute the first transistor T1. In an embodiment, the first gate electrode GAT1 may include or consist of a metal, an alloy, a conductive metal oxide, a transparent conductive material, or the like. In embodiments, materials that may be used as the first gate electrode GAT1 may include silver (Ag), silver-containing alloys, molybdenum (Mo), molybdenum-containing alloys, aluminum (Al), or aluminum. alloy, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), or the like. These may be used alone or in combination with each other. Also, the first gate electrode GAT1 may include or consist of a single layer or a multilayer.

The third insulating layer IL3 may be disposed on the first gate electrode GAT1. In an embodiment, the third insulating layer IL3 may include or consist of an insulating material. In embodiments, the insulating material that may be used as the third insulating layer IL3 may include silicon oxide, silicon nitride, silicon oxynitride, or the like.

The capacitor electrode CSTE may be disposed on the third insulating layer IL3. The first gate electrode GAT1 and the capacitor electrode CSTE may constitute the storage capacitor CST. In an embodiment, the capacitor electrode CSTE may include or consist of a metal, an alloy, a conductive metal oxide, a transparent conductive material, or the like.

The fourth insulating layer IL4 may be disposed on the capacitor electrode CSTE. In an embodiment, the fourth insulating layer IL4 may include or consist of an insulating material. In embodiments, the insulating material that may be used as the fourth insulating layer IL4 include silicon oxide, silicon nitride, silicon oxynitride, or the like.

The fifth insulating layer IL5 may be disposed on the fourth insulating layer IL4. The fifth insulating layer IL5 may uniformly provide heat to the second active pattern ACT2 during the crystallization process of the second active pattern ACT2. In an embodiment, the fifth insulating layer IL5 may include or consist of an insulating material. In embodiments, the insulating material that may be used as the fifth insulating layer IL5 may include silicon oxide, silicon nitride, silicon oxynitride, or the like. These may be used alone or in combination with each other. Also, the fifth insulating layer IL5 may include or consist of a single layer or a multilayer.

The second active pattern ACT2 may be disposed on the fifth insulating layer IL5. The second active pattern ACT2 may include a second channel area CH2, a third doped area DP3, and a fourth doped area DP4. The second channel area CH2 may overlap the second gate electrode GAT2. Each of the third doped area DP3 and the fourth doped area DP4 may be adjacent to the second channel area CH2.

In an embodiment, the second active pattern ACT2 may include or consist of a silicon semiconductor material or an oxide semiconductor material. In embodiments, the silicon semiconductor material that may be used as the second active pattern ACT2 may include amorphous silicon, polycrystalline silicon, or the like. In embodiments, the oxide semiconductor material that may be used as the second active pattern ACT2 may include IGZO (InGaZnO), ITZO (InSnZnO), or the like. In addition, the oxide semiconductor material may further include indium (In), gallium (Ga), tin (Sn), zirconium (Zr), vanadium (V), hafnium (Hf), cadmium (Cd), germanium (Ge), chromium (Cr)), titanium (Ti), or zinc (Zn). These may be used alone or in combination with each other.

In an embodiment, the second active pattern ACT2 may include polycrystalline silicon doped with the second impurity. In an embodiment, polycrystalline silicon may be formed by performing the crystallization process on amorphous silicon, and the third doped area DP3 and the fourth doped area DP4 may be doped with the second impurity, for example. In an embodiment, the crystallization process may be performed at about 450° C. for about 60 minutes, for example.

In an embodiment, the second impurity may include an N-type impurity. Accordingly, the second transistor T2 may be implemented as the NMOS transistor. In an embodiment, the N-type impurity may include phosphorus (P) ions, for example. A second dose amount in which the phosphorus (P) ions are doped into the second active pattern ACT2 may be approximately 1e15 atoms/cm2. In an embodiment, the second dose amount may be substantially the same as the first dose amount.

The sixth insulating layer IL6 may be disposed on the second active pattern ACT2. In an embodiment, the sixth insulating layer IL6 may include or consist of an insulating material. In embodiments, the insulating material that may be used as the sixth insulating layer IL6 may include silicon oxide, silicon nitride, silicon oxynitride, or the like.

The second gate electrode GAT2 may be disposed on the sixth insulating layer IL6. The second active pattern ACT2 and the second gate electrode GAT2 may constitute the second transistor T2. In an embodiment, the second gate electrode GAT2 may include or consist of a metal, an alloy, a conductive metal oxide, a transparent conductive material, or the like.

The first anode pad AP1 may be disposed on the sixth insulating layer IL6. The first anode pad AP1 may be connected to the second doped area DP2 and the fourth doped area DP4. In other words, the second doped area DP2 may be electrically connected to the fourth doped area DP4. In an embodiment, the first anode pad AP1 may include substantially the same material as that of the second gate electrode GAT2.

The seventh insulating layer IL7 may be disposed on the second gate electrode GAT2. In an embodiment, the seventh insulating layer IL7 may include or consist of an insulating material. In embodiments, the insulating material that may be used as the seventh insulating layer IL7 may include silicon oxide, silicon nitride, silicon oxynitride, or the like.

The high voltage line VDDL may be disposed on the seventh insulating layer IL7. The high voltage line VDDL may be connected to the first doped area DPL. The first doped area DP1 may receive the first voltage ELVDD through the high voltage line VDDL. In an embodiment, the high voltage line VDDL may include or consist of a metal, an alloy, a conductive metal oxide, a transparent conductive material, or the like.

The gate node electrode GNE may be disposed on the seventh insulating layer IL7. The gate node electrode GNE may be connected to the first gate electrode GAT1 and the third doped area DP3. In other words, the first gate electrode GAT1 may be electrically connected to the third doped area DP3. In an embodiment, the gate node electrode GNE may include substantially the same material as that of the high voltage line VDDL.

The eighth insulating layer IL8 may be disposed on the gate node electrode GNE. In an embodiment, the eighth insulating layer IL8 may include or consist of an organic insulating material and/or an inorganic insulating material. In embodiments, the organic insulating material that may be used as the eighth insulating layer IL8 may include photoresist, polyacrylic resin, polyimide resin, acrylic resin, or the like. In embodiments, the inorganic insulating material that may be used as the eighth insulating layer IL8 may include silicon oxide, silicon nitride, silicon oxynitride, or the like. These may be used alone or in combination with each other. Also, the eighth insulating layer IL8 may include or consist of a single layer or a multilayer.

The data line DL may be disposed on the eighth insulating layer IL8. The data voltage DATA may be provided to the data line DL. In an embodiment, the data line DL may include or consist of a metal, an alloy, a conductive metal oxide, a transparent conductive material, or the like.

The ninth insulating layer IL9 may be disposed on the data line DL. In an embodiment, the ninth insulating layer IL9 may include or consist of an organic insulating material and/or an inorganic insulating material.

The initialization voltage line VINTL may be disposed on the ninth insulating layer IL9. The initialization voltage VINT may be provided to the initialization voltage line VINTL, and the initialization voltage line VINTL may be connected to the capacitor electrode CSTE. In other words, the capacitor electrode CSTE may receive the initialization voltage VINT. In an embodiment, the initialization voltage line VINTL may include or consist of a metal, an alloy, a conductive metal oxide, a transparent conductive material, or the like.

The second anode pad AP2 may be disposed on the ninth insulating layer IL9. The second anode pad AP2 may be connected to the first anode pad AP1. The data line DL and the second anode pad AP2 may constitute the program capacitor CPR. In an embodiment, the second anode pad AP2 may include substantially the same material as that of the initialization voltage line VINTL.

The tenth insulating layer IL10 may be disposed on the initialization voltage line VINTL. In an embodiment, the tenth insulating layer IL10 may include or consist of an organic insulating material and/or an inorganic insulating material.

The anode electrode ANDE may be disposed on the tenth insulating layer IL10. The anode electrode ANDE may be connected to the second anode pad AP2. In an embodiment, the anode electrode ANDE may include or consist of a metal, an alloy, a conductive metal oxide, a transparent conductive material, or the like.

The pixel defining layer PDL may be disposed on the anode electrode ANDE. An opening exposing the anode electrode ANDE may be defined in the pixel defining layer PDL.

The emission layer EL may be disposed on the anode electrode ANDE, and may be formed in the opening of the pixel defining layer PDL. The light-emitting layer EL may emit light in response to the driving current.

The cathode electrode CTDE may be disposed on the emission layer EL. In an embodiment, the cathode electrode CTED may include or consist of a metal, an alloy, a conductive metal oxide, a transparent conductive material, or the like.

The pixel circuit PC1 included in the display device 1000 may include the first transistor T1 and the second transistor T2. The first transistor T1 may include or consist of polycrystalline silicon doped with the first impurity (e.g., boron (B) ions). Accordingly, the first transistor T1 may be the PMOS transistor. The second transistor T2 may include or consist of polycrystalline silicon doped with the second impurity (e.g., phosphorus (P) ions). Accordingly, the second transistor T2 may be the NMOS transistor.

As the first transistor T1 is implemented as the PMOS transistor, a leakage current of the first transistor T1 may be reduced. Also, as the second transistor T2 is implemented as the NMOS transistor, electron mobility of the second transistor T2 may be improved.

In order to implement the first transistor T1 and the second transistor T2 as different types of transistors, the display device 1000 may include the first active pattern ACT1 and the second active pattern ACT2. The first active pattern ACT1 may include polycrystalline silicon doped with the first impurity. The second active pattern ACT2 may be disposed on the first active pattern ACT1 and may include polycrystalline silicon doped with the second impurity. As the second active pattern ACT2 is disposed on the first active pattern ACT1, the area of the pixel circuit PC1 may be reduced and the resolution of the display device 1000 may be improved.

Figure 6:
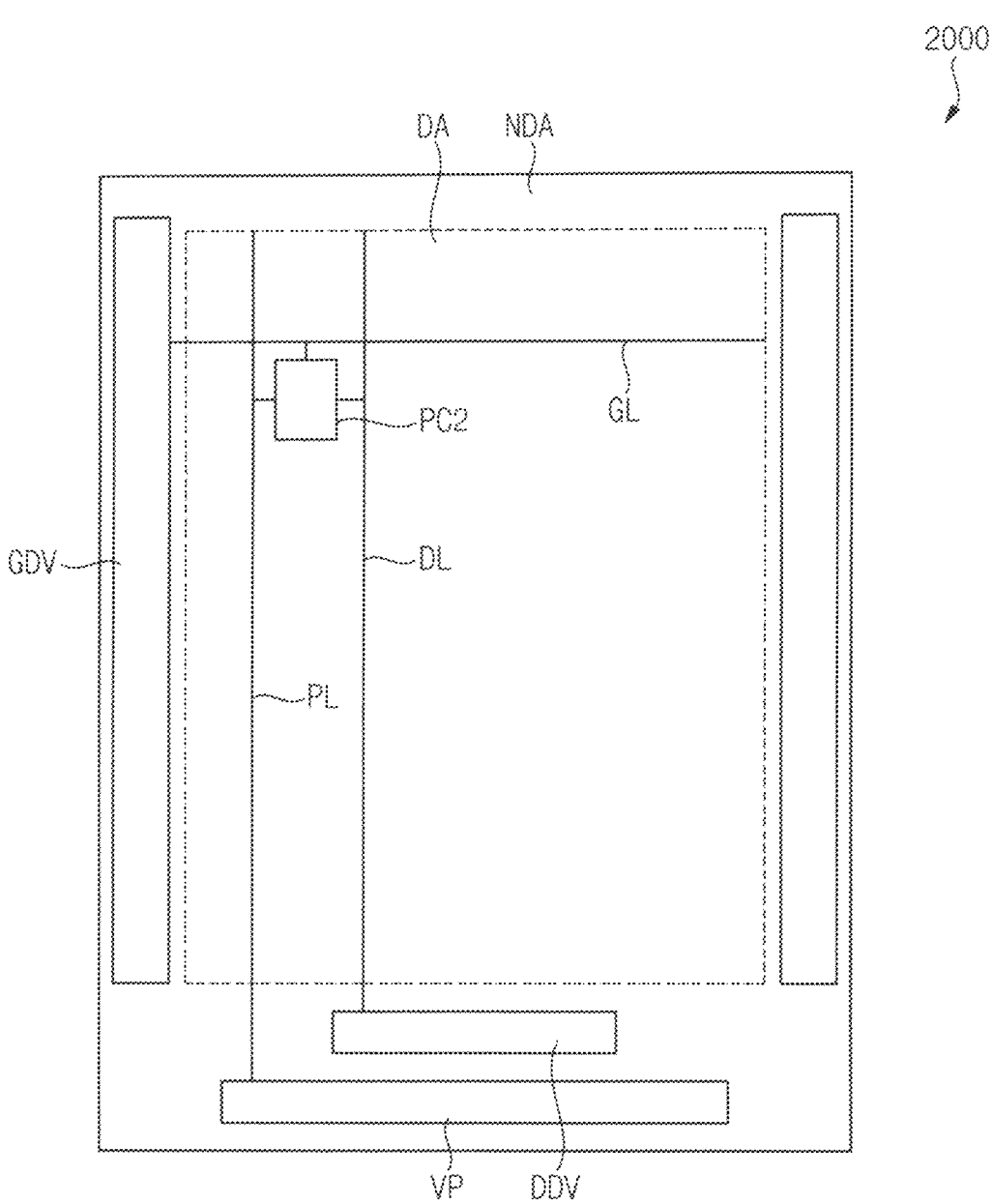
FIG. 6 is a plan view illustrating an embodiment of a display device.
Figure 7:
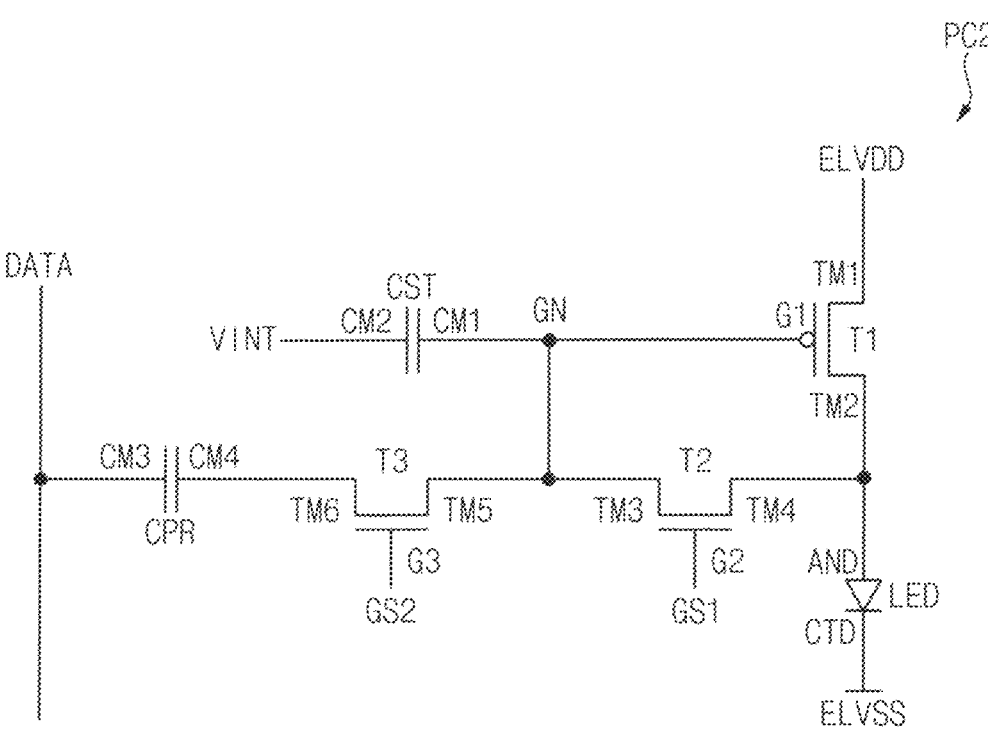
FIG. 7 is a circuit diagram illustrating a pixel circuit included in the display device of FIG. 6.

FIG. 6 is a plan view illustrating an embodiment of a display device, and FIG. 7 is a circuit diagram illustrating an embodiment of a pixel circuit included in the display device of FIG. 6.

Referring to FIG. 6, an embodiment of the display device 2000 may be divided into a display area DA and a non-display area NDA. The display device 2000 may be substantially the same as the display device 1000 described with reference to FIG. 1 except for the pixel circuit PC2.

The pixel circuit PC2 may be connected to the gate driver GDV through the gate line GL, may be connected to the data driver DDV through the data line DL, and may be connected to the voltage driver VP through the voltage line PL.

Referring to FIG. 7, the pixel circuit PC2 may include a first transistor T1, a second transistor T2, a third transistor T3, a storage capacitor CST, a program capacitor CPR, and a light-emitting diode LED.

The first transistor T1 may include a first gate terminal G1 electrically connected to a gate node GN, a first terminal TM1 electrically connected to a first voltage ELVDD, and a second terminal TM2 electrically connected to a light-emitting diode LED.

In an embodiment, the first terminal TM1 and the second terminal TM2 may include or consist of polycrystalline silicon doped with a first impurity. In an embodiment, the first impurity may include a P-type impurity (e.g., boron (B) ions), for example.

The second transistor T2 may include a second gate terminal G2 electrically connected to a first gate signal GS1, a third terminal TM3 electrically connected to the gate node GN, and a fourth terminal TM4 electrically connected to the light-emitting diode LED.

In an embodiment, the third terminal TM3 and the fourth terminal TM4 may include or consist of polycrystalline silicon doped with a second impurity. In an embodiment, the second impurity may be different from the first impurity, and may include an N-type impurity (e.g., phosphorus (P) ions), for example.

The third transistor T3 may include a third gate terminal G3 electrically connected to a second gate signal GS2, a fifth terminal TM5 electrically connected to the gate node GN, and a sixth terminal TM6 electrically connected to the program capacitor CPR. In an embodiment, the third transistor T3 may be connected in series with the second transistor T2 through the gate node GN.

In an embodiment, the fifth terminal TM5 and the sixth terminal TM6 may include or consist of polycrystalline silicon doped with the second impurity.

In an embodiment, the first transistor T1 may be a PMOS transistor, and each of the second transistor T2 and the third transistor T3 may be an NMOS transistor.

The storage capacitor CST may include a first capacitor terminal CM1 electrically connected to the gate node GN and a second capacitor terminal CM2 electrically connected to the initialization voltage VINT.

The program capacitor CPR may include a third capacitor terminal CM3 electrically connected to the data voltage DATA and a fourth capacitor terminal CM4 electrically connected to the sixth terminal TM6.

The light-emitting diode LED may include an anode terminal AND electrically connected to the second terminal TM2 and the fourth terminal TM4 and a cathode terminal CTD electrically connected to a second voltage ELVSS.

Figure 8:
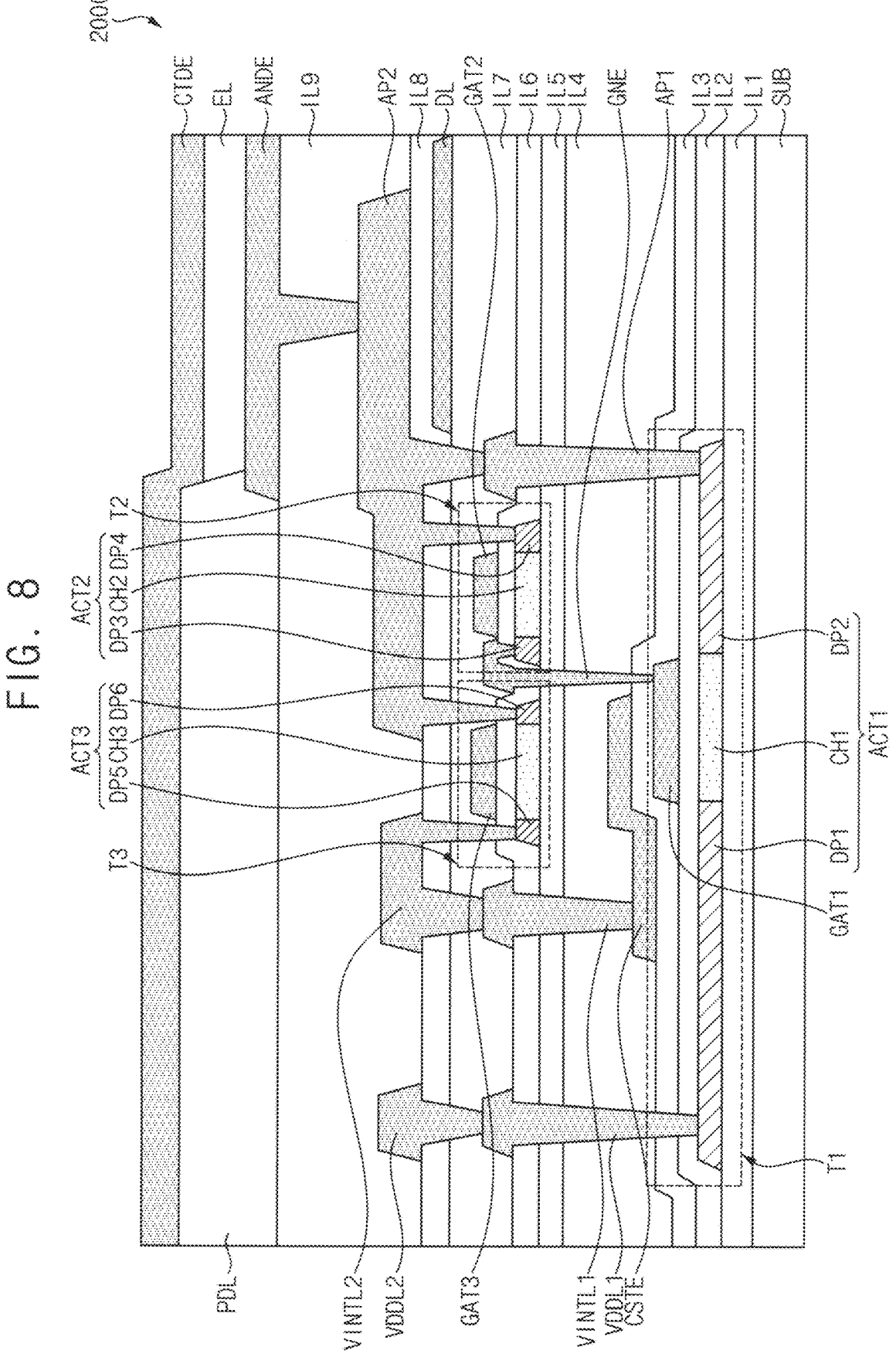
FIG. 8 is a cross-sectional view illustrating the display device of FIG. 6.

FIG. 8 is a cross-sectional view illustrating the display device of FIG. 6.

Referring to FIG. 8, the display device 2000 may include a substrate SUB, a first insulating layer IL1, a first active pattern ACT1, a second insulating layer IL2, a first gate electrode GAT1, a third insulating layer IL3, a capacitor electrode CSTE, a fourth insulating layer IL4, a fifth insulating layer IL5, a second active pattern ACT2, a sixth insulating layer IL6, a second gate electrode GAT2, a first high voltage line VDDL1, a first initialization voltage line VINTL1, a gate node electrode GNE, a first anode pad AP1, a seventh insulating layer IL7, a data line DL, an eighth insulating layer IL8, a second high voltage line VDDL2, a second initialization voltage line VINTL2, a second anode pad AP2, a ninth insulating layer IL9, an anode electrode ANDE, a pixel defining layer PDL, a light-emitting layer EL, and a cathode electrode CTDE.

The substrate SUB may include a transparent or opaque material. In an embodiment, the material that may be used as the substrate SUB may include glass, quartz, plastic, or the like. These may be used alone or in combination with each other.

The first insulating layer IL1 may be disposed on the substrate SUB. The first insulating layer IL1 may uniformly provide heat to the first active pattern ACT1 during the crystallization process of the first active pattern ACT1. In an embodiment, the first insulating layer IL1 may include or consist of an insulating material. In embodiments, the insulating material that may be used as the first insulating layer IL1 may include silicon oxide, silicon nitride, silicon oxynitride, or the like. These may be used alone or in combination with each other. Also, the first insulating layer IL1 may include or consist of a single layer or a multilayer.

The first active pattern ACT1 may be disposed on the first insulating layer IL1. The first active pattern ACT1 may include a first channel area CH1, a first doped area DP1, and a second doped area DP2. The first channel area CH1 may overlap the first gate electrode GAT1. Each of the first doped area DP1 and the second doped area DP2 may be adjacent to the first channel area CH1.

In an embodiment, the first active pattern ACT1 may include or consist of a silicon semiconductor material or an oxide semiconductor material. In embodiments, the silicon semiconductor material that may be used as the first active pattern ACT1 may include amorphous silicon, polycrystalline silicon, or the like. In embodiments, the oxide semiconductor material that may be used as the first active pattern ACT1 may include IGZO (InGaZnO), ITZO (InSnZnO), or the like. In addition, the oxide semiconductor material may further include indium (In), gallium (Ga), tin (Sn), zirconium (Zr), vanadium (V), hafnium (Hf), cadmium (Cd), germanium (Ge), chromium (Cr)), titanium (Ti), or zinc (Zn). These may be used alone or in combination with each other.

In an embodiment, the first active pattern ACT1 may include polycrystalline silicon doped with the first impurity. In an embodiment, polycrystalline silicon may be formed by performing the crystallization process on amorphous silicon, and the first doped area DP1 and the second doped area DP2 may be doped with the first impurity, for example. In an embodiment, the crystallization process may be performed at about 450° C. for about 60 minutes, for example.

In an embodiment, the first impurity may include a P-type impurity. Accordingly, the first transistor T1 may be implemented as the PMOS transistor. In an embodiment, the P-type impurity may include boron (B) ions, for example. A first dose amount in which the boron (B) ions are doped into the first active pattern ACT1 may be approximately 1e15 atoms/cm2.

The second insulating layer IL2 may be disposed on the first active pattern ACT1. In an embodiment, the second insulating layer IL2 may include or consist of an insulating material. In embodiments, the insulating material that may be used as the second insulating layer IL2 may include silicon oxide, silicon nitride, silicon oxynitride, or the like.

The first gate electrode GAT1 may be disposed on the second insulating layer IL2. The first active pattern ACT1 and the first gate electrode GAT1 may constitute the first transistor T1. In an embodiment, the first gate electrode GAT1 may include or consist of a metal, an alloy, a conductive metal oxide, a transparent conductive material, or the like. In embodiments, materials that may be used as the first gate electrode GAT1 may include silver (Ag), silver-containing alloys, molybdenum (Mo), molybdenum-containing alloys, aluminum (Al), or aluminum. alloy, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), or the like. These may be used alone or in combination with each other. Also, the first gate electrode GAT1 may include or consist of a single layer or a multilayer.

The third insulating layer IL3 may be disposed on the first gate electrode GAT1. In an embodiment, the third insulating layer IL3 may include or consist of an insulating material. In embodiments, the insulating material that may be used as the third insulating layer IL3 may include silicon oxide, silicon nitride, silicon oxynitride, or the like.

The capacitor electrode CSTE may be disposed on the third insulating layer IL3. The first gate electrode GAT1 and the capacitor electrode CSTE may constitute the storage capacitor CST. In an embodiment, the capacitor electrode CSTE may include or consist of a metal, an alloy, a conductive metal oxide, a transparent conductive material, or the like.

The fourth insulating layer IL4 may be disposed on the capacitor electrode CSTE. In an embodiment, the fourth insulating layer IL4 may include or consist of an insulating material. In embodiments, the insulating material that may be used as the fourth insulating layer IL4 include silicon oxide, silicon nitride, silicon oxynitride, or the like.

The fifth insulating layer IL5 may be disposed on the fourth insulating layer IL4. The fifth insulating layer IL5 may uniformly provide heat to the second active pattern ACT2 during the crystallization process of the second active pattern ACT2. In an embodiment, the fifth insulating layer IL5 may include or consist of an insulating material. In embodiments, the insulating material that may be used as the fifth insulating layer IL5 may include silicon oxide, silicon nitride, silicon oxynitride, or the like. These may be used alone or in combination with each other. Also, the fifth insulating layer IL5 may include or consist of a single layer or a multilayer.

The second active pattern ACT2 may be disposed on the fifth insulating layer IL5. The second active pattern ACT2 may include a second channel area CH2, a third doped area DP3, and a fourth doped area DP4. The second channel area CH2 may overlap the second gate electrode GAT2. Each of the third doped area DP3 and the fourth doped area DP4 may be adjacent to the second channel area CH2.

In an embodiment, the second active pattern ACT2 may include or consist of a silicon semiconductor material or an oxide semiconductor material. In embodiments, the silicon semiconductor material that may be used as the second active pattern ACT2 may include amorphous silicon, polycrystalline silicon, or the like. In embodiments, the oxide semiconductor material that may be used as the second active pattern ACT2 may include IGZO (InGaZnO), ITZO (InSnZnO), or the like. In addition, the oxide semiconductor material may further include indium (In), gallium (Ga), tin (Sn), zirconium (Zr), vanadium (V), hafnium (Hf), cadmium (Cd), germanium (Ge), chromium (Cr)), titanium (Ti), or zinc (Zn). These may be used alone or in combination with each other.

In an embodiment, the second active pattern ACT2 may include polycrystalline silicon doped with the second impurity. In an embodiment, polycrystalline silicon may be formed by performing the crystallization process on amorphous silicon, and the third doped area DP3 and the fourth doped area DP4 may be doped with the second impurity, for example. In an embodiment, the crystallization process may be performed at about 450° C. for about 60 minutes, for example.

In an embodiment, the second impurity may include an N-type impurity. Accordingly, the second transistor T2 may be implemented as the NMOS transistor. In an embodiment, the N-type impurity may include phosphorus (P) ions, for example. A second dose amount in which the phosphorus (P) ions are doped into the second active pattern ACT2 may be approximately 1e15 atoms/cm2. In an embodiment, the second dose amount may be substantially the same as the first dose amount.

The third active pattern ACT3 may be disposed in the same layer as the second active pattern ACT2. The third active pattern ACT3 may include a third channel area CH3, a fifth doped area DP5, and a sixth doped area DP6. The third channel area CH3 may overlap the third gate electrode GAT3. Each of the fifth doped area DP5 and the sixth doped area DP6 may be adjacent to the third channel area CH3.

In an embodiment, the third active pattern ACT3 may include or consist of a silicon semiconductor material or an oxide semiconductor material. In embodiments, the silicon semiconductor material that may be used as the second active pattern ACT2 may include amorphous silicon, polycrystalline silicon, or the like. In embodiments, the oxide semiconductor material that may be used as the second active pattern ACT2 may include IGZO (InGaZnO), ITZO (InSnZnO), or the like. In addition, the oxide semiconductor material may further include indium (In), gallium (Ga), tin (Sn), zirconium (Zr), vanadium (V), hafnium (Hf), cadmium (Cd), germanium (Ge), chromium (Cr)), titanium (Ti), or zinc (Zn). These may be used alone or in combination with each other.

In an embodiment, the third active pattern ACT3 may include polycrystalline silicon doped with the second impurity. In an embodiment, polycrystalline silicon may be formed by performing the crystallization process on amorphous silicon, and the fifth doped area DP5 and the sixth doped area DP6 may be doped with the second impurity, for example. In an embodiment, the crystallization process may be performed at about 450° C. for about 60 minutes, for example.

In an embodiment, the second impurity may include an N-type impurity. Accordingly, the third transistor T3 may be implemented as the NMOS transistor.

The sixth insulating layer IL6 may be disposed on the second active pattern ACT2 and the third active pattern ACT3. In an embodiment, the sixth insulating layer IL6 may include or consist of an insulating material. In embodiments, the insulating material that may be used as the sixth insulating layer IL6 may include silicon oxide, silicon nitride, silicon oxynitride, or the like.

The second gate electrode GAT2 may be disposed on the sixth insulating layer IL6. The second active pattern ACT2 and the second gate electrode GAT2 may constitute the second transistor T2. In an embodiment, the second gate electrode GAT2 may include or consist of a metal, an alloy, a conductive metal oxide, a transparent conductive material, or the like.

The third gate electrode GAT3 may be disposed in the same layer as the second gate electrode GAT2. The third active pattern ACT3 and the third gate electrode GAT3 may constitute the third transistor T3. In an embodiment, the third gate electrode GAT3 may include substantially the same material as that of the second gate electrode GAT2.

The first high voltage line VDDL1 may be disposed in the same layer as the second gate electrode GAT2. The first high voltage line VDDL1 may be connected to the first doped area DP1. In an embodiment, the first high voltage line VDDL1 may include substantially the same material as that of the second gate electrode GAT2.

The first initialization voltage line VINTL1 may be disposed in the same layer as the second gate electrode GAT2. The first initialization voltage line VINTL1 may be connected to the capacitor electrode CSTE. In an embodiment, the first initialization voltage line VINTL1 may include substantially the same material as that of the second gate electrode GAT2.

The gate node electrode GNE may be disposed in the same layer as the second gate electrode GAT2. The gate node electrode GNE may be connected to the first gate electrode GAT1 and the third doped area DP3. In other words, the first gate electrode GAT1 may be electrically connected to the third doped area DP3. In an embodiment, the gate node electrode GNE may include substantially the same material as that of the second gate electrode GAT2.

The first anode pad AP1 may be disposed in the same layer as the second gate electrode GAT2. The first anode pad AP1 may be connected to the second doped area DP2. In an embodiment, the first anode pad AP1 may include substantially the same material as that of the second gate electrode GAT2.

The seventh insulating layer IL7 may be disposed on the second gate electrode GAT2. In an embodiment, the seventh insulating layer IL7 may include or consist of an insulating material. In embodiments, the insulating material that may be used as the seventh insulating layer IL7 may include silicon oxide, silicon nitride, silicon oxynitride, or the like.

The data line DL may be disposed on the seventh insulating layer IL7. The data voltage DATA may be provided to the data line DL. In an embodiment, the data line DL may include a metal, an alloy, a conductive metal oxide, a transparent conductive material, or the like.

The eighth insulating layer IL8 may be disposed on the gate node electrode GNE. In an embodiment, the eighth insulating layer IL8 may include or consist of an organic insulating material and/or an inorganic insulating material. In embodiments, the organic insulating material that may be used as the eighth insulating layer IL8 may include photoresist, polyacrylic resin, polyimide resin, acrylic resin, or the like. In embodiments, the inorganic insulating material that may be used as the eighth insulating layer IL8 may include silicon oxide, silicon nitride, silicon oxynitride, or the like. These may be used alone or in combination with each other. Also, the eighth insulating layer IL8 may include or consist of a single layer or a multilayer.

The second high voltage line VDDL2 may be disposed on the eighth insulating layer IL8. The second high voltage line VDDL2 may be connected to the first high voltage line VDDL1. The first doped area DP1 may receive the first voltage ELVDD through the first high voltage line VDDL1 and the second high voltage line VDDL2. In an embodiment, the second high voltage line VDDL2 may include or consist of a metal, an alloy, a conductive metal oxide, a transparent conductive material, or the like.

The second initialization voltage line VINTL2 may be disposed in the same layer as the second high voltage line VDDL2. The second initialization voltage line VINTL2 may be connected to the first initialization voltage line VINTL1 and the fifth doped area DP5. In other words, the capacitor electrode CSTE and the fifth doped area DP5 may be electrically connected. The capacitor electrode CSTE may receive the initialization voltage VINT through the first initialization voltage line VINTL1 and the second initialization voltage line VINTL2. In an embodiment, the second initialization voltage line VINTL2 may include substantially the same material as that of the second high voltage line VDDL2.

The second anode pad AP2 may be disposed in the same layer as the second high voltage line VDDL2. The second anode pad AP2 may be connected to the first anode pad AP1, the fourth doped area DP4, and the sixth doped area DP6. In other words, the second doped area DP2 may be electrically connected to the fourth doped area DP4 and the sixth doped area DP6.

The ninth insulating layer IL9 may be disposed on the second high voltage line VDDL2. In an embodiment, the ninth insulating layer IL9 may include or consist of an organic insulating material and/or an inorganic insulating material.

The anode electrode ANDE may be disposed on the ninth insulating layer IL9. The anode electrode ANDE may be connected to the second anode pad AP2. In an embodiment, the anode electrode ANDE may include or consist of a metal, an alloy, a conductive metal oxide, a transparent conductive material, or the like.

The pixel defining layer PDL may be disposed on the anode electrode ANDE. An opening exposing the anode electrode ANDE may be defined in the pixel defining layer PDL.

The emission layer EL may be disposed on the anode electrode ANDE, and may be formed in the opening of the pixel defining layer PDL. The light-emitting layer EL may emit light in response to the driving current.

The cathode electrode CTDE may be disposed on the emission layer EL. In an embodiment, the cathode electrode CTED may include or consist of a metal, an alloy, a conductive metal oxide, a transparent conductive material, or the like.

The pixel circuit PC2 included in the display device 2000 may include the first transistor T1, the second transistor T2, and the third transistor T3. The first transistor T1 may include or consist of polycrystalline silicon doped with the first impurity (e.g., boron (B) ions). Accordingly, the first transistor T1 may be the PMOS transistor. The second transistor T2 may include or consist of polycrystalline silicon doped with the second impurity (e.g., phosphorus (P) ions). Accordingly, the second transistor T2 may be the NMOS transistor. The third transistor T3 may include or consist of polycrystalline silicon doped with the second impurity. Accordingly, the third transistor T3 may be the NMOS transistor.

As the first transistor T1 is implemented as the PMOS transistor, a leakage current of the first transistor T1 may be reduced. In addition, as each of the second transistor T2 and the third transistor T3 is implemented as the NMOS transistor, the electron mobility of each of the second transistor T2 and the third transistor T3 may be improved. Also, as the third transistor T3 is connected in series with the second transistor T2 through the gate node GN, a leakage current at the gate node GN may be reduced.

In order to implement the first transistor T1, the second transistor T2 and the third transistor T3 as different types of transistors, the display device 2000 may include the first active pattern ACT1, the second active pattern ACT2 and the third active pattern ACT3. The first active pattern ACT1 may include polycrystalline silicon doped with the first impurity. The second active pattern ACT2 and the third active pattern ACT3 may be disposed on the first active pattern ACT1 and may include polysilicon doped with the second impurity.

Figure 9:
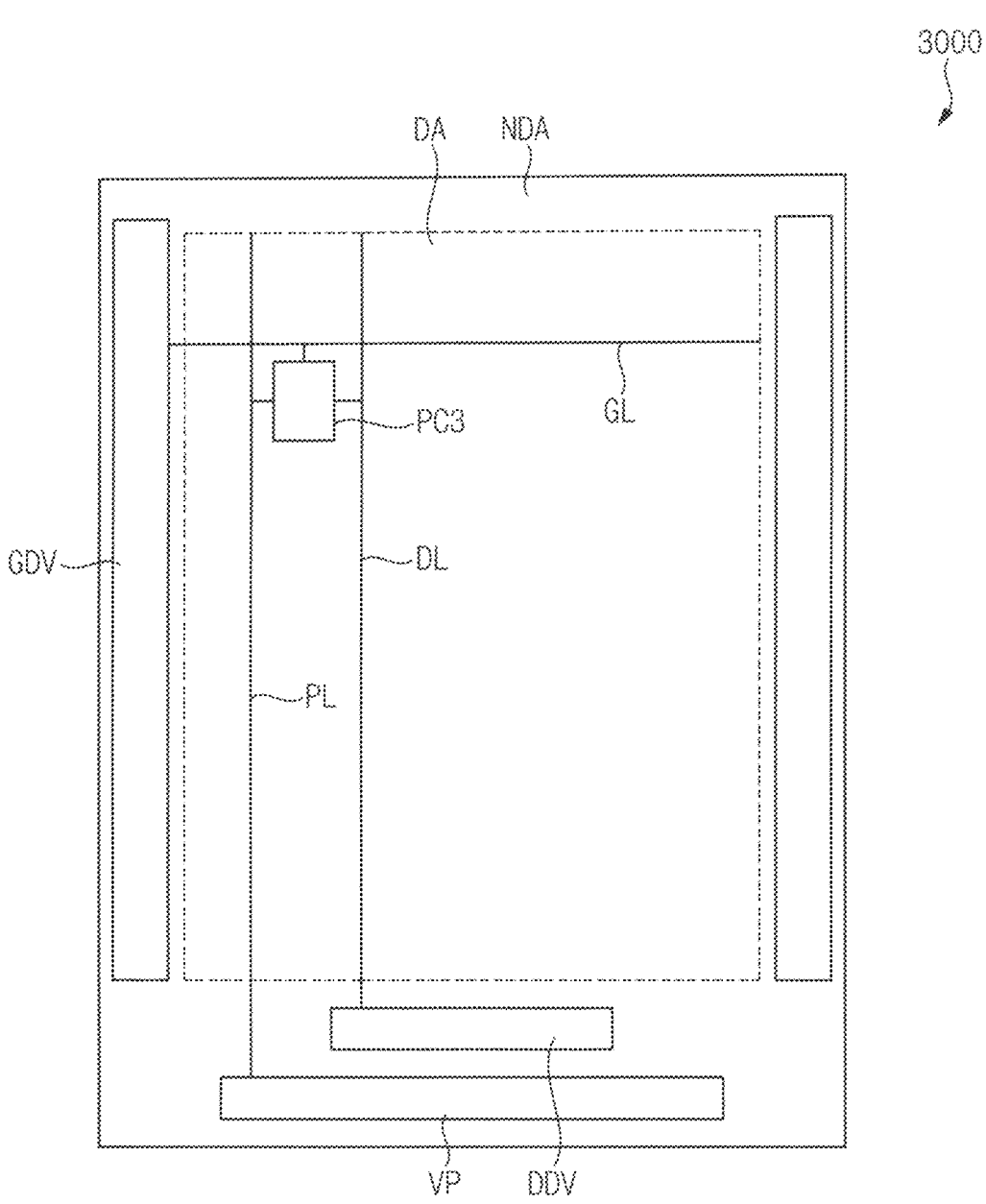
FIG. 9 is a plan view illustrating an embodiment of a display device.
Figure 10:
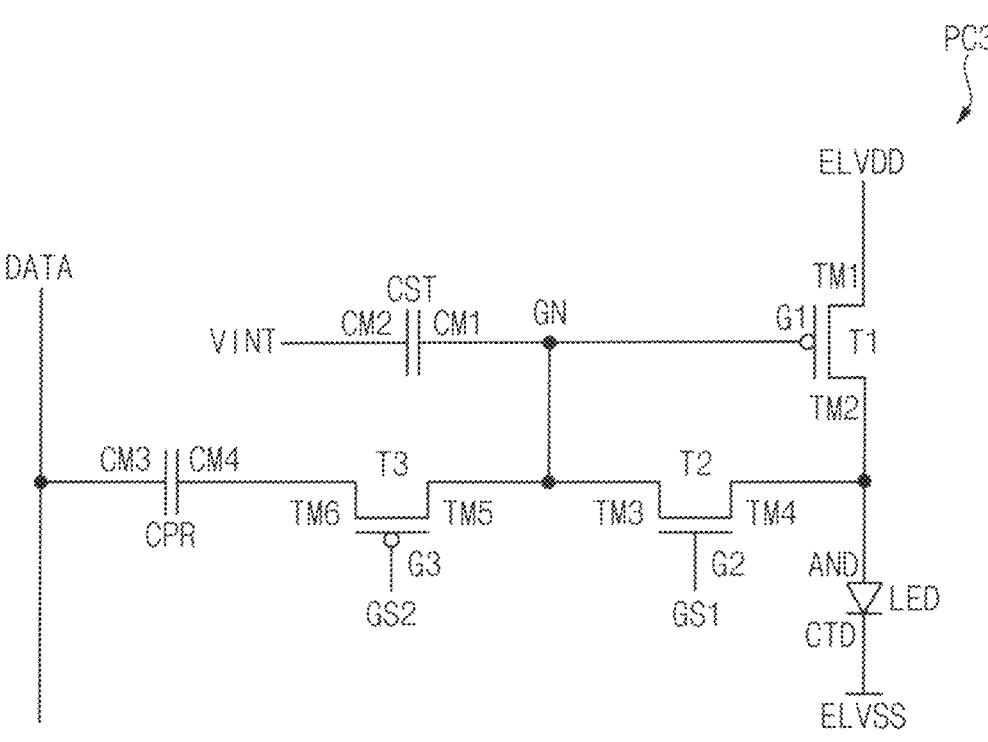
FIG. 10 is a circuit diagram illustrating a pixel circuit included in the display device of FIG. 9.

FIG. 9 is a plan view illustrating an embodiment of a display device, and FIG. 10 is a circuit diagram illustrating a pixel circuit included in the display device of FIG. 9.

Referring to FIG. 9, the display device 3000 in the embodiment may be divided into a display area DA and a non-display area NDA. The display device 3000 may be substantially the same as the display device 1000 described with reference to FIG. 1, except for the pixel circuit PC3.

The pixel circuit PC3 may be connected to the gate driver GDV through the gate line GL, may be connected to the data driver DDV through the data line DL, and may be connected to the voltage driver VP through the voltage line PL Referring to FIG. 10, the pixel circuit PC3 may include a first transistor T1, a second transistor T2, a third transistor T3, a storage capacitor CST, a program capacitor CPR, and a light-emitting diode LED.

The first transistor T1 may include a first gate terminal G1 electrically connected to a gate node GN, a first terminal TM1 electrically connected to a first voltage ELVDD, and a second terminal TM2 electrically connected to the light-emitting diode LED.

In an embodiment, the first terminal TM1 and the second terminal TM2 may include or consist of polycrystalline silicon doped with a first impurity. In an embodiment, the first impurity may include a P-type impurity (e.g., boron (B) ions), for example.

The second transistor T2 may include a second gate terminal G2 electrically connected to the first gate signal GS1, a third terminal TM3 electrically connected to the gate node GN, and a fourth terminal TM4 electrically connected to the light-emitting diode LED.

In an embodiment, the third terminal TM3 and the fourth terminal TM4 may include or consist of polycrystalline silicon doped with a second impurity. In an embodiment, the second impurity may be different from the first impurity, and may include an N-type impurity (e.g., phosphorus (P) ions), for example.

The third transistor T3 may include a third gate terminal G3 electrically connected to a second gate signal GS2, a fifth terminal TM5 electrically connected to the gate node GN, and a sixth terminal TM6 electrically connected to the program capacitor CPR. In an embodiment, the third transistor T3 may be connected in series with the second transistor T2 through the gate node GN.

In an embodiment, the fifth terminal TM5 and the sixth terminal TM6 may include or consist of polycrystalline silicon doped with the first impurity.

In an embodiment, each of the first transistor T1 and the third transistor T3 may be a PMOS transistor, and the second transistor T2 may be an NMOS transistor.

The storage capacitor CST may include a first capacitor terminal CM1 electrically connected to the gate node GN and a second capacitor terminal CM2 electrically connected to the initialization voltage VINT.

The program capacitor CPR may include a third capacitor terminal CM3 electrically connected to the data voltage DATA and a fourth capacitor terminal CM4 electrically connected to the sixth terminal TM6.

The light-emitting diode LED may include an anode terminal AND electrically connected to the second terminal TM2 and the fourth terminal TM4 and a cathode terminal CTD electrically connected to a second voltage ELVSS.

The pixel circuit PC3 included in the display device 3000 may include the first transistor T1, the second transistor T2, and the third transistor T3. The first transistor T1 may include or consist of polycrystalline silicon doped with the first impurity (e.g., boron (B) ions). Accordingly, the first transistor T1 may be the PMOS transistor. The second transistor T2 may include or consist of polycrystalline silicon doped with the second impurity (e.g., phosphorus (P) ions). Accordingly, the second transistor T2 may be the NMOS transistor. The third transistor T3 may include or consist of polycrystalline silicon doped with the first impurity. Accordingly, the third transistor T3 may be the PMOS transistor.

As the first transistor T1 and the third transistor T3 are implemented as PMOS transistors, a leakage current of the first transistor T1 and the third transistor T3 may be reduced. Also, as the second transistor T2 is implemented as an NMOS transistor, electron mobility of the second transistor T2 may be improved. Also, as the third transistor T3 is connected in series with the second transistor T2 through the gate node GN, a leakage current at the gate node GN may be reduced.

Figure 11:
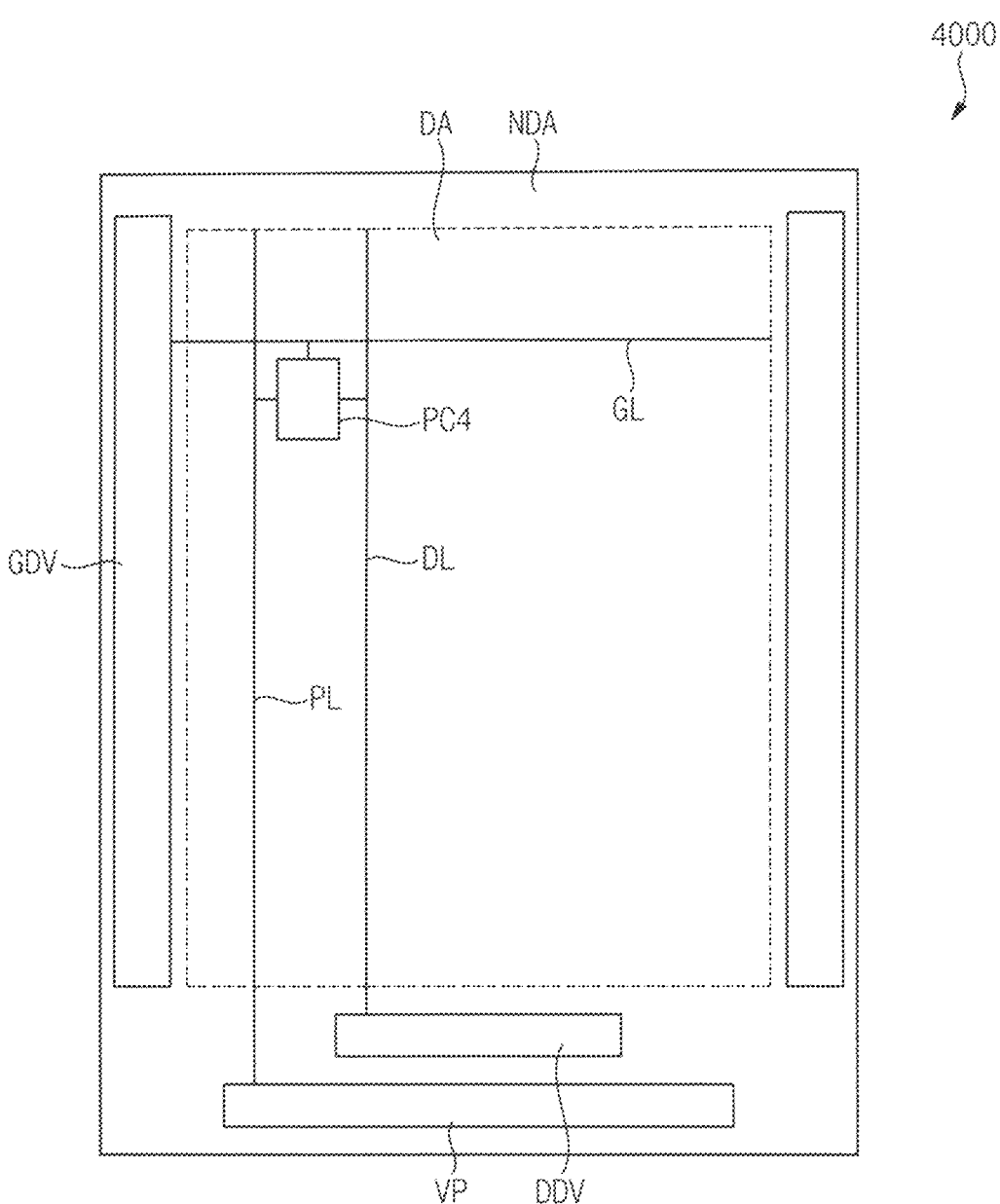
FIG. 11 is a plan view illustrating an embodiment of a display device.
Figure 12:
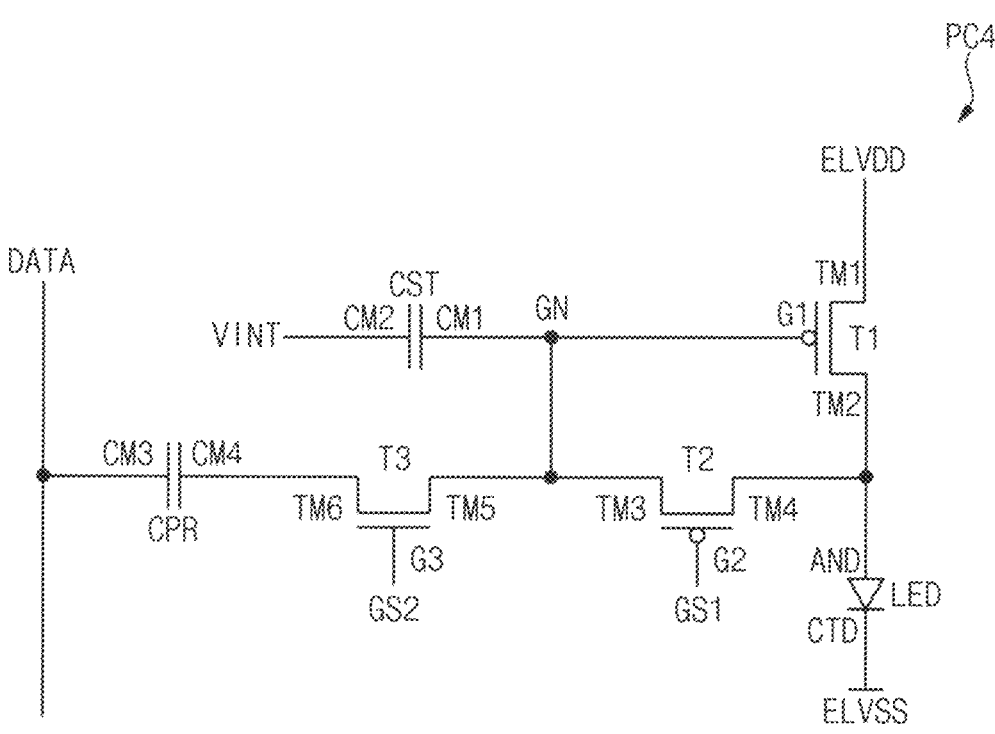
FIG. 12 is a circuit diagram illustrating a pixel circuit included in the display device of FIG. 11.

FIG. 11 is a plan view illustrating a display device according to a fourth embodiment, and FIG. 12 is a circuit diagram illustrating a pixel circuit included in the display device of FIG. 11.

Referring to FIG. 11, the display device 4000 according to the fourth embodiment may be divided into a display area DA and a non-display area NDA. The display device 4000 may be substantially the same as the display device 1000 described with reference to FIG. 1, except for the pixel circuit PC4.

The pixel circuit PC4 may be connected to the gate driver GDV through the gate line GL, may be connected to the data driver DDV through the data line DL, and may be connected to the voltage driver VP through the voltage line PL.

Referring to FIG. 12, the pixel circuit PC4 may include a first transistor T1, a second transistor T2, a third transistor T3, a storage capacitor CST, a program capacitor CPR, and a light-emitting diode LED.

The first transistor T1 may include a first gate terminal G1 electrically connected to a gate node GN, a first terminal TM1 electrically connected to a first voltage ELVDD, and a second terminal TM2 electrically connected to the light-emitting diode LED.

In an embodiment, the first terminal TM1 and the second terminal TM2 may include or consist of polycrystalline silicon doped with a first impurity. In an embodiment, the first impurity may include a P-type impurity (e.g., boron (B) ions), for example.

The second transistor T2 may include a second gate terminal G2 electrically connected to the first gate signal GS1, a third terminal TM3 electrically connected to the gate node GN, and a fourth terminal TM4 electrically connected to the light-emitting diode LED.

In an embodiment, the third terminal TM3 and the fourth terminal TM4 may include or consist of polycrystalline silicon doped with the first impurity.

The third transistor T3 may include a third gate terminal G3 electrically connected to a second gate signal GS2, a fifth terminal TM5 electrically connected to the gate node GN, and a sixth terminal TM6 electrically connected to the program capacitor CPR. In an embodiment, the third transistor T3 may be connected in series with the second transistor T2 through the gate node GN.

In an embodiment, the fifth terminal TM5 and the sixth terminal TM6 may include or consist of polycrystalline silicon doped with a second impurity. In an embodiment, the second impurity may be different from the first impurity, and may include an N-type impurity (e.g., phosphorus (P) ions), for example.

In an embodiment, the first transistor T1 and the second transistor T2 may be a PMOS transistor, and the third transistor T3 may be an NMOS transistor.

The storage capacitor CST may include a first capacitor terminal CM1 electrically connected to the gate node GN and a second capacitor terminal CM2 electrically connected to the initialization voltage VINT.

The program capacitor CPR may include a third capacitor terminal CM3 electrically connected to the data voltage DATA and a fourth capacitor terminal CM4 electrically connected to the sixth terminal TM6.

The light-emitting diode LED may include an anode terminal AND electrically connected to the second terminal TM2 and the fourth terminal TM4 and a cathode terminal CTD electrically connected to a second voltage ELVSS.

The pixel circuit PC4 included in the display device 4000 may include the first transistor T1, the second transistor T2, and the third transistor T3. The first transistor T1 may include or consist of polycrystalline silicon doped with the first impurity (e.g., boron (B) ions). Accordingly, the first transistor T1 may be the PMOS transistor. The second transistor T2 may include or consist of polycrystalline silicon doped with the first impurity. Accordingly, the second transistor T2 may be the PMOS transistor. The third transistor T3 may include or consist of polycrystalline silicon doped with the second impurity (e.g., phosphorus (P) ions). Accordingly, the third transistor T3 may be the NMOS transistor.

As the first transistor T1 and the second transistor T2 are implemented as PMOS transistors, a leakage current of the first transistor T1 and the second transistor T2 may be reduced. Also, as the third transistor T3 is implemented as an NMOS transistor, electron mobility of the third transistor T3 may be improved. Also, as the third transistor T3 is connected in series with the second transistor T2 through the gate node GN, a leakage current at the gate node GN may be reduced.

Embodiments of the disclosure should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A pixel circuit comprising:
a first transistor including:
    a first gate terminal electrically connected to a gate node;
    a first terminal including polycrystalline silicon doped with a first impurity and electrically connected to a first voltage; and
    a second terminal including polycrystalline silicon doped with the first impurity;
a second transistor including:
    a second gate terminal electrically connected to a first gate signal;
    a third terminal including polycrystalline silicon doped with a second impurity different from the first impurity and electrically connected to the gate node; and
    a fourth terminal including polycrystalline silicon doped with the second impurity; and
a light-emitting diode including:
    an anode terminal electrically connected to the second terminal; and
    a cathode terminal electrically connected to a second voltage,
wherein the anode terminal is further electrically connected to the fourth terminal.

2. The pixel circuit of claim 1, wherein the first impurity includes a P-type impurity, and the second impurity includes an N-type impurity.

3. The pixel circuit of claim 1, wherein the first transistor is a p-channel metal-oxide-semiconductor transistor, and the second transistor is an n-channel metal-oxide-semiconductor transistor.

4. The pixel circuit of claim 1, further comprising:
a storage capacitor including a first capacitor terminal electrically connected to the gate node and a second capacitor terminal electrically connected to an initialization voltage.

5. The pixel circuit of claim 4, further comprising:
a program capacitor including a third capacitor terminal electrically connected to a data voltage and a fourth capacitor terminal electrically connected to the anode terminal.

6. The pixel circuit of claim 1, further comprising:
a third transistor including a third gate terminal electrically connected to a second gate signal, a fifth terminal including polycrystalline silicon doped with the second impurity and electrically connected to the gate node and a sixth terminal including polycrystalline silicon doped with the second impurity.

7. The pixel circuit of claim 1, further comprising:
a third transistor including a third gate terminal electrically connected to a second gate signal, a fifth terminal including polycrystalline silicon doped with the first impurity and electrically connected to the gate node and a sixth terminal including polycrystalline silicon doped with the first impurity.

8. A pixel circuit comprising:
a first transistor including:
    a first gate terminal electrically connected to a gate node;
    a first terminal including polycrystalline silicon doped with a first impurity and electrically connected to a first voltage; and
    a second terminal including polycrystalline silicon doped with the first impurity;
a second transistor including:
    a second gate terminal electrically connected to a first gate signal;
    a third terminal including polycrystalline silicon doped with the first impurity and electrically connected to the gate node; and
    a fourth terminal including polycrystalline silicon doped with the first impurity;
a third transistor including:
    a third gate terminal electrically connected to a second gate signal;
    a fifth terminal including polycrystalline silicon doped with a second impurity different from the first impurity and electrically connected to the gate node; and a sixth terminal including polycrystalline silicon doped with the second impurity; and a light-emitting diode including:

an anode terminal electrically connected to the second terminal; and a cathode terminal electrically connected to a second voltage, wherein the anode terminal is further electrically connected to the fourth terminal.

9. The pixel circuit of claim 8, wherein the first impurity includes a P-type impurity, and the second impurity includes an N-type impurity.

10. The pixel circuit of claim 8, wherein the first transistor is a p-channel metal-oxide-semiconductor transistor, and the second transistor is an n-channel metal-oxide-semiconductor transistor.

\* \* \* \* \*